United States Patent [19]
Fischer

[11] Patent Number: 5,698,351
[45] Date of Patent: Dec. 16, 1997

[54] METHOD FOR PRODUCING A SCREEN PRINTING STENCIL

[75] Inventor: Hannes Fischer, Worgl, Austria

[73] Assignee: Schablonentechnik Kufstein Aktiengesellschaft, Kufstein, Austria

[21] Appl. No.: 601,769

[22] Filed: Feb. 15, 1996

[30] Foreign Application Priority Data

Feb. 15, 1995 [EP] European Pat. Off. ............ 95102103

[51] Int. Cl.⁶ .................................................. G03F 9/00
[52] U.S. Cl. ........................... 430/6; 430/396; 101/132
[58] Field of Search ..................... 430/6, 396, 397, 430/945; 101/132

[56] References Cited

U.S. PATENT DOCUMENTS

| | | | |
|---|---|---|---|
| 4,808,790 | 2/1989 | Rückl | 219/121.68 |
| 4,928,593 | 5/1990 | Rückl | 101/389.1 |
| 5,338,627 | 8/1994 | Shigeta | 430/6 |

FOREIGN PATENT DOCUMENTS

| | | |
|---|---|---|
| 304587 | 12/1972 | Austria . |
| 0329217 | 8/1989 | European Pat. Off. . |
| 0593806 | 4/1994 | European Pat. Off. . |
| 1559784 | 3/1969 | France . |
| 1231258 | 12/1966 | Germany . |
| 3601327 | 8/1986 | Germany . |
| 6608264 | 12/1967 | Netherlands . |

*Primary Examiner*—Christopher G. Young

[57] ABSTRACT

A method for producing a screen printing stencil comprises the following: applying at least one light-sensitive layer to an essentially closed covering surface of a cylindrical base body; removing portions of the light-sensitive layer from the covering surface in accordance with a prescribed screen pattern; filling the portions thus removed of the light-sensitive layer with metal for the purpose of forming a cylindrical screen; and removing the cylindrical screen from the base body. A hollow cylinder is used as the base body and is inflated via at least one of its ends by a compressed gas to such an extent that it obtains a circular cross-section.

16 Claims, 5 Drawing Sheets

METHOD FOR PRODUCING A SCREEN PRINTING STENCIL

BACKGROUND OF THE INVENTION

1. Field of the Invention

The invention relates to a method for producing a screen printing stencil.

2. Description of Related Art

A method for producing a screen printing stencil is already known from U.S. Pat. No. 5,338,627. This known method comprises the following steps: applying at least one light-sensitive layer to an essentially closed covering surface of a cylindrical base body; removing portions of the light-sensitive layer from the covering surface in accordance with a prescribed screen pattern; filling the portions thus removed of the light-sensitive layer with metal for the purpose of forming a cylindrical screen; and removing the cylindrical screen from the base body.

In the known method, the cylindrical base body is a solid roll and is therefore heavy and cumbersome.

SUMMARY OF THE INVENTION

An object of the present invention is to provide a method for producing a screen printing stencil using a lighter base body without decreasing accuracy.

A method according to the present invention includes using a hollow cylinder as the base body, and inflating this hollow cylinder via at least one of its ends by a compressed gas to such an extent that the hollow cylinder obtains a circular cross-section.

Because of the weight of the hollow cylinder is relatively low in comparison with that of the solid cylinder, the former can also be more simply positioned and supported. This is advantageous when used, for example, with applying the light-sensitive layer, exposing this light-sensitive layer and/or applying the metal to form the cylindrical screen. Thus, the hollow cylinder can be handled more easily and the method may be carried out more simply.

If compressed gas is blown into the hollow cylinder through one of the ends of the hollow cylinder, the other end of the hollow cylinder can be closed. However, it is also possible to allow compressed gas to flow into the hollow cylinder via both ends. In this case, air under pressure is preferably used as compressed gas. This gas can be from a compressed air line network or, for example, can be produced by an axial blower which is seated on the cylinder axle when the latter is clamped in a rotary machine.

As already mentioned, a laser beam can be used for exposing the light-sensitive layer, the laser beam impinging on the light-sensitive layer and being deflected in the longitudinal direction of the hollow cylinder when the latter is rotated about its axis. In this case, the portions of the light-sensitive layer can be removed by burning away these portions by the laser radiation. For this purpose, the laser beam is focused accordingly. The light-sensitive layer can be a single layer or a double layer. When using a double layer, the layer can have an adhesion reinforcing layer located on the surface of the base body and a pigmented layer located on this adhesion reinforcing layer.

It is also possible to remove portions of the light-sensitive layer by polymerizing the light-sensitive layer laser radiation and subsequently developing the layer. The exposed portions harden as a result of polymerization and remain in place, while the unexposed portions are removed during the development process.

Accordingly to an advantageous refinement of the invention, a polymerizable light-sensitive layer which has at least one pigmented first resin layer on the surface of the hollow cylinder and a second transparent and photosensitized resin layer on the first resin layer is used.

Accordingly to a very advantageous development of the invention, the exposure of the light-sensitive layer results in later screen openings having different distances from each other.

In the case of matrix engraving, i.e., engraving including a hollow cylinder and a light-sensitive layer, the different distances between the screen openings are particularly advantageous in the half-tone technique. Half-tones, or the use of different ink intensities during printing, can be produced fundamentally in two different ways.

First, the screen openings can be designed to have different sizes. This is the only possibility if the screen has already been prefabricated, screen openings of essentially the same size are present and these openings also always have the same spacing. The screen is then closed with a coating and this coating is variously removed. For example, one group of screen openings is exposed, for example, by a laser, and other groups of screen openings are left closed.

Another possibility consists in arranging screen openings of the same size at different distances. These distances are selected to be larger if less ink is intended to get onto the substrate to be printed and vice versa.

While the first method leads to non-uniform patterns, or patterns overlaid by disturbances, i.e., a type of ink moiré pattern, the second method varies opening distances of the screen so that the mixed color formation produced by ink overlays becomes much more uniform.

According to another advantageous development of the invention, when filling the removed portions of the light-sensitive layer with metal, the base body is reinforced from the inside. This reinforcement can be carried out, for example, by introducing a hose into the base body. The hose can consist, for example, of rubber, resting on the inner wall of the base body. In this way, the base body or hollow cylinder is not only largely rounded out but, in spite of the mechanical loading during the application of the metal, remains substantially dimensionally stable. The hose can also be inflated, which leads to a further improved reinforcement or stiffening. As a result of the internal reinforcement of the hollow cylinder, for example, lift forces of the electrolytic bath can be largely compensated for.

The use of a hollow cylinder as a base body has the further advantage that the cylindrical screen formed on the hollow cylinder may be removed more easily. For this purpose, only the cylindrical screen is pressed radially inward by a suitable rounded object, so that a dent is produced at the corresponding location. A local shear stress, which breaks the adhesive forces between the metallic screen and the base body or hollow cylinder, results.

These and other objects of the present invention will become more readily apparent from detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limited to the present invention and wherein.

DETAILED DESCRIPTION OF THE PREFERRED EMBODIMENTS

In the present invention, a thin-walled hollow cylinder is equipped with one or more light-sensitive coating layers. The hollow cylinder consists of a thin metal sheet with a continuous covering surface. The wall thickness of the hollow cylinder is approximately 0.1 to 0.3 mm. The hollow cylinder can be several meters long and several tens of centimeters in diameter.

Figure 1:
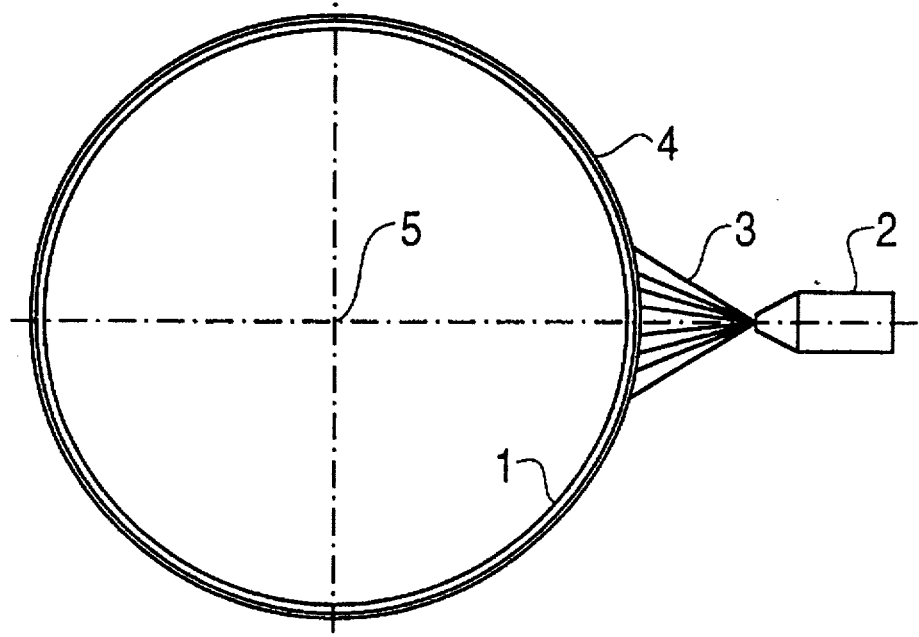
FIG. 1 shows spraying a light-sensitive layer onto the uninterrupted covering surface of a hollow cylindrical base body.

In accordance with FIG. 1, the coating of a hollow cylinder 1 can performed using a spray nozzle 2. The spray nozzle 2 produces a mist 3 of the coating which is then deposited on the outer covering surface of the hollow cylinder 1, in order to form a thin coating film 4 thereon. During this process, the hollow cylinder 1 can rotate about its longitudinal axis 5 and the spray nozzle 2 is moved at a low speed parallel to the longitudinal axis 5.

Figure 2:
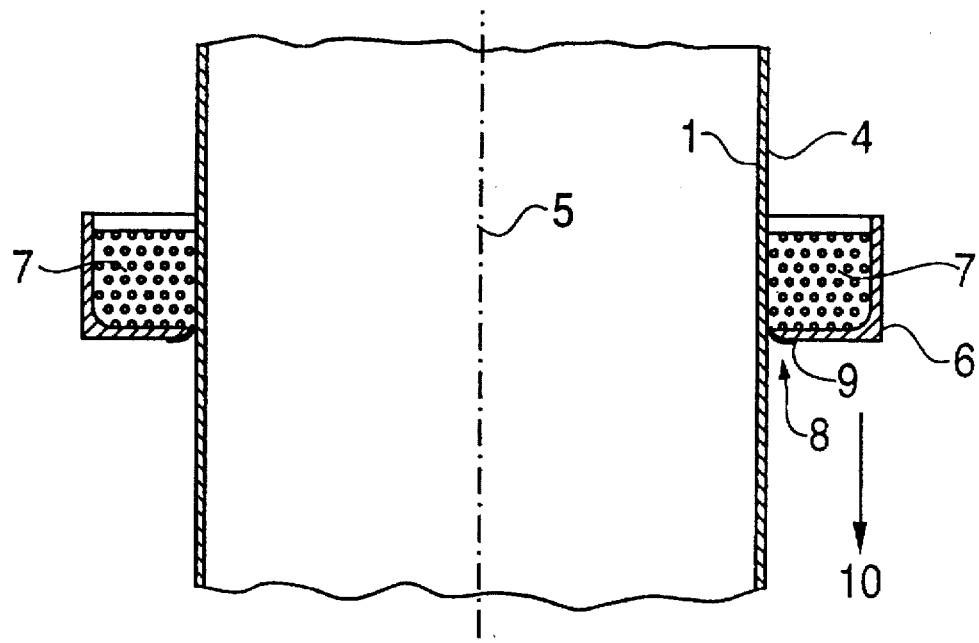
FIG. 2 shows applying a light-sensitive layer to the uninterrupted covering surface of a hollow cylindrical base body.

FIG. 2 shows a case in which the hollow cylinder 1 is coated with coating using an annular trough 6. A coating emulsion 7 is located in the annular trough 6. A sealing lip 9 seals the annular trough 6 at 8 in such a way that no coating emulsion 7 can emerge downwards. The annular trough 6 is slowly lowered downwards in the direction of the arrow 10. As a result, a thin film coating 4 forms on the surface of the hollow cylinder 1. The film 4 is precipitated more thinly the slower the downwardly directed lowering movement of the annular trough 6.

Figure 3:
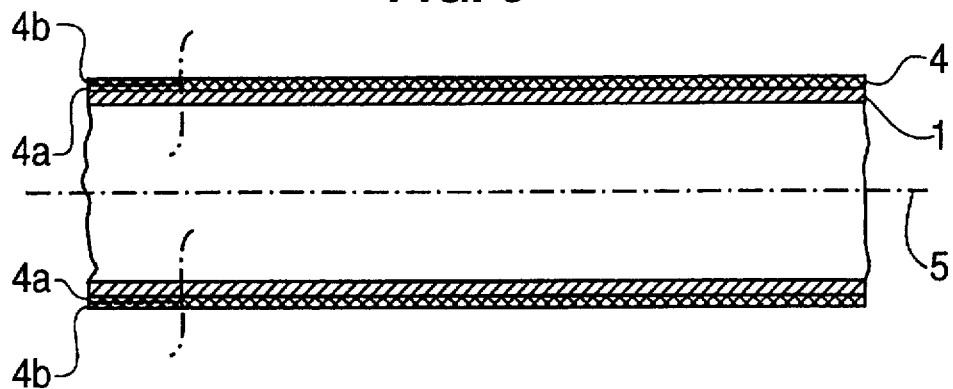
FIG. 3 shows a longitudinal section through a hollow cylindrical base body with an uninterrupted covering surface and a light-sensitive layer lying thereon.

FIG. 3 represents the result of the coating process shown in FIG. 2 broken down into orders of magnitude. Here, the hollow cylinder 1 has the coating layer 4 on its outer covering surface. The thickness of layer 4 can be compared with the diameter of the hollow cylinder 1, which is respectively considerably thicker than the wall thickness of the hollow cylinder.

Figure 4:
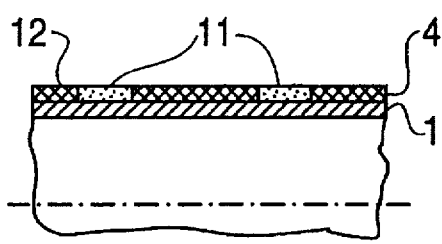
FIG. 4 shows a longitudinal section according to FIG. 3 with an exposed and partly polymerized light-sensitive layer.

FIG. 4 shows a section from FIG. 3. The coating layer 4 is light-sensitive, e.g., the layer can be polymerized by light. Specifically, the layer is effected in accordance with exposure corresponding to the pattern requirements. More precisely, portions 11 of the coating layer 4 have been exposed and, as a result, have experienced a structural change. In general, during the exposure, double bonds existing in the coating layer 4 are broken. These broken double bonds react with adjacent chain molecules of the coating or of the resin, since similarly broken double bonds are present in the latter. A cross-linking occurs, and hence a hardening. Also, as a result of the cross-linking, a higher chemical resistance is achieved. In a subsequent development process, the non-exposed portions, and thus less resistant resin portions, are dissolved out of the coating layer 4.

For the development process, the entire hollow cylinder 1 with the coating layer 4, which is located thereon and has been exposed, is immersed in a developer medium which is located in a trough. Those points 12 of the coating layer 4 which have not been cross-linked by the effect of light are dissolved. Expediently, the developer liquid can consist of an alkaline solution (e.g., soda, potassium hydroxide, sodium hydroxide). To support the development process, unused developer solution can be sprayed from a shower onto the surface of the coating layer 4 to be developed. The hollow cylinder 1, with the coating layer 4 located thereon, rotates about its longitudinal axis 5 during the development process and is partially immersed in the developer liquid.

Figure 5:
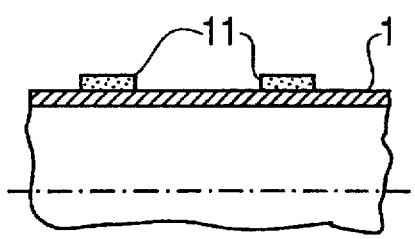
FIG. 5 shows the structure according to FIG. 4 after development has been carried out.

The result of the development process is shown in FIG. 5. Only the cross-linked portions 11 of the coating layer 4 remain on the surface of the hollow cylinder 1.

According to a variant of the method of the present invention, instead of a simple coating layer 4, a double coating layer can also be used, as also shown in FIG. 3. In this case, a more strongly light-absorbing layer 4a comes to lie directly on the outer covering surface of the hollow cylinder 1. Strong light absorption can be achieved by the addition of higher quantities of a light-absorbing pigment to the resin base compound. A further layer 4b is applied to the layer 4a. The layer 4b is kept largely transparent and generally also contains a higher quantity of a sensitizing agent. Of course, complete transparency of this second layer 4b is not possible, since irradiation which is intended to have the effect of cross-linking is conditional on the capture of light quanta by the resin. As a result of this capture process, exactly those photochemical processes which finally lead to cross-linking are initiated. The first resin layer is pigmented with a pigment which absorbs the light energy in a dissipative manner and sensitizes the first resin layer either not at all of only weakly. The thin and preferably very transparent second resin layer, which has a high proportion of a photo-sensitizing agent responds. This wavelength lies, for example, preferably in the range from 380 nm to about 532 nm and may be made supplied by a suitable laser. Both the resin layers have in each case on average a thickness of about 5 μm to 10 μm.

The advantage of this technique consists in the fact that the undersized polymerization phenomena are prevented, specifically in portions of the resin which are first exposed by light which is reflected or scattered at irregularities on the surface of the hollow cylinder. The resin system can thus on the one hand be more finely structured, specifically at a relatively large layer thickness, as a result of which on the other hand separation phenomena during the subsequent development process are also prevented.

The layers are composed of the basic resin system, photo-initiator and a pigmented colorant. The basic resin system consists of one of the following components or of a copolymer of these: hydroxymethyl acrylate, aromatic acrylate, methylmethacrylate, and polyepoxide.

One of the following is preferably used as photosensitizer or photo-initiator: a titanocene (for example titanocenedichloride, μ-chlorobis-μ-methylene titanium, methyltris titanium), N-vinyl pyrrolidones, ferrocene, or mixtures of these components.

The colorants are colored pigments which are known per se; these pigments should be present in the resin substance in a very fine distribution (about 1 μm particle size) with resin channels between the pigments. As a result of this arrangement, at each light reflection, part of the light energy is absorbed in a dissipative manner, i.e., is finally converted into heat. The resulting temperature rise is, however, too low to initiate a thermally induced cross-linking process.

Preferably, the first resin layer can contain a further substance by which radicals set free during exposure are intercepted, in order to prevent to a still further extent undesired widening of the contours if these radicals are not used as a result of the polymerization process itself.

The double layer technology, applying the layers 4a and 4b, is particularly advantageous if fine and sharp contours are intended to be produced. As a result of the underlaid pigment layer 4a, the diffuse scattered light effect which leads to broadening of the contours and is caused by the metallic, and typically also slightly scratched surface, of the hollow cylinder 1, is prevented. The two different layers 4a and 4b, which are necessary in the case of this method variant, are applied one after the other with one of the methods described in FIG. 1 or FIG. 2. In each case, after the application of a layer, the respective layer is dried. The exposure of the polymerizable layers can be carried out using a laser beam of which the wavelength lies, for example, in the range from 320 nm to 550 nm. This is discussed in more detail further below.

Figure 6:
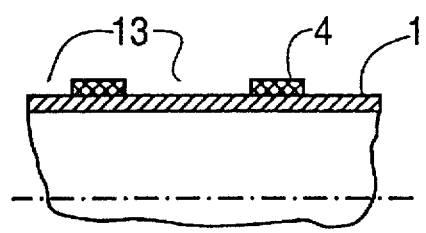
FIG. 6 shows a longitudinal section according to FIG. 3 with portions of the light-sensitive layer which have been obtained by removing the portions lying alongside them of the light-sensitive layer by thermal or lithographic ablation.

However, as is shown in FIG. 6, the exposure process can also be carried out in such a way that, as a result of thermal or lithographic ablation, exposed points 13 of the coating layer 4 are directly removed or burnt away. For this process, a higher radiation power of the laser is generally necessary. However, for this exposure process, the chemical development process previously required, which is more environmentally damaging, is dispensed with.

The layers preferably consist of: acrylate resins and methacrylate resins, epoxy resins, unsaturated polyester resins (unsaturated before and during the application), using styrene as copolymerizing agent, butadiene resins and styrene as copolymerizing agent, crosslinked polyurethane resins (in particular as adhesion promoting layer).

The upper resin layer, i.e., the resin covering layer, is intended to have particularly good absorption properties for the laser radiation introduced. The adhesion promoting layer which is applied directly to the metallic base body, must have high adhesive forces on the metallic hollow cylinder. It can be said in general that these adhesive forces ar higher if the wettability of the adhesion promoting layer applied is high in the liquid state, i.e., before its crosslinking. This adhesion capability can be increased, for example, by surface-active substances, i.e., those which reduce surface tension (for example alcohols). The adhesive force of the coating layer is brought about by mechanical and chemicophysical effects.

The mechanical effect comprises a clamping effect (press-stud) effect), to which the surface roughness of the metal wall contributes. In the case of a relatively low surface tension of the still liquid adhesion promoter, the latter can penetrate better into the depths of the roughness. Nevertheless, air residues cannot be totally expelled from these regions.

Chemosorption and molecular forces (Van der Waal forces) are included in the chemicophysical causes of the adhesive force. It will be understood that these forces also depend on the magnitude of the area actually wetted.

The adhesion promoting layer must therefore preferably have a good wetting capability. Polyurethanes, for example, are addition polymerization products of isocyanates (Desmodure) and polyesters (Desmophene). The isocyanates particularly increase the chemicophysical adhesive force components.

The high absorption of the covering layer of the double layer system can be increased by incorporating colored pigments (for example carbon black) in a correspondingly fine distribution. The laser radiation peters out between the colored particles as a result of the multiple reflection and is converted in this manner into thermal energy which is freed directly in the resin layer and thus leads to its decomposition, even if the resin base substance has a high transmissivity for the laser radiation. Since the layers are generally very thin (10 to 20 μm), the heat released in one layer is also passed on by convection to the other layer (for example the adhesion promoting layer).

The division into a double layer also has the advantage that the upper covering layer can also be matched better to the loadings during the later printing process. The resin base substance of the coating layer can be selected in accordance with its capacity to resist the mechanical and chemical loadings during the printing process (for example, an addition of highly-dispersed silica increases its abrasion resistance) and the adhesion promoting layer can be selected such that its adhesive force to the metallic cylinder is large.

In a further method step, thermal post-hardening of the portions of the resin layer 4 remaining on the hollow cylinder is carried out. These can therefore be the portions according to FIG. 5 or FIG. 6. All the double bonds still present in the resin portions remaining on the hollow cylinder 1 are crosslinked by burning-in or tempering at temperatures of about 140° to 160° C. Thus, particularly good behavior in the next process step is effected.

Figure 7:
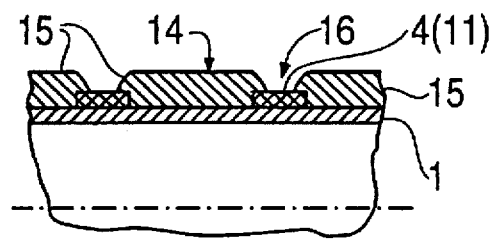
FIG. 7 shows the structure according to FIGS. 5 or 6 with a metallic layer applied by electroplating.

This next process step is shown schematically in FIG. 7. This step may be, for example, electroplating the cylinder with nickel or a chemical nickel bath. Nickel is deposited onto the bare metallic points of the hollow cylinder 1 between the crosslinked portions of the coating layer 4. In this way, a nickel screen 14 having webs 15 and screen openings 16 is formed.

As a result of the burning-in or post-tempering, the remaining portions of the coating layer 4 have become very resistant to chemicals and, as a result, also less susceptible to swelling up in the bath liquid. In particular, when using an electroplating nickel application process, layers are not sufficiently resistant to chemicals, swelling of the coating layer can occur. As a result, breakthrough of the current through the remaining coating layer portions may occur. Nickel beads would grow there these nickel beads would finally be connected to the webs 15 and would close the screen openings 16.

After forming the nickel screen 14 on the hollow cylinder 1 according to FIG. 7, the screen 14 is removed from the hollow cylinder 1, as will be explained. The removed nickel screen 14 can then be used as a screen printing stencil, for example for the printing of textiles and the like. Once the nickel screen 14 is uniformly perforated, it can be coated once more with a coating and subsequently exposed in order to expose openings of the screen 14 in accordance with a pattern.

In the following text, with reference to FIG. 8, it is described how the hollow cylinder 1, provided with the light-sensitive layer 4, is treated in order to obtain the structures shown in FIGS. 5 and 6.

The hollow cylinder 1, provided with the light-sensitive layer 4, is supported at its two ends in a rotary engraving machine by two end pegs of truncated conical shape. A laser beam supplies a pattern image corresponding to the structures shown in FIGS. 5 and 6 to the light-sensitive coating.

If the coating layer 4 is intended to be burnt away using the laser beam, a $CO_2$ gas laser with a wavelength of 10.6 µm can then be used for this purpose. On the other hand, for the crosslinking process already mentioned, use is made of a laser with a wavelength in the range from 320 nm to 550 nm.

In addition, the hollow cylinder 1 is rounded out in a circular shape in its cross-sectional form by blowing in air or another suitable working gas. During the entire exposure or engraving process, the hollow cylinder is always held in as uniformly circular a form as possible by keeping the gas pressure constant in its interior.

Investigations in conjunction with the rotation of thin-walled metallic cylinders have led to the surprising result that, in spite of internal material stresses which occur more or less randomly, it is possible to shape these hollow cylinders by a suitable internal pressure so exactly into a circle that, during the exposure of the light-sensitive layer 4 located on the hollow cylinder 1, the focus of the laser beam is moved in the longitudinal direction of the hollow cylinder. Structural shape deviations of the hollow cylinder can thus be compensated to the largest possible extent, so that excellent results are obtained. FIG. 8 shows a general view of a device for exposing the hollow cylinder. The hollow cylinder 1 and the coating layer 4 are shown in detail in FIG. 3. The hollow cylinder 1 is a thin-walled metal cylinder with a completely closed covering surface. Any small number of pores which may be present and caused by manufacture in this cylinder will not be discussed.

The hollow cylinder 1 is supported at both its open ends, i.e., a tailstock end and a headstock end. Specifically, a supporting cone 17 engages at the tailstock end and a supporting cone 18 engages at the headstock end. A rotary drive for introducing rotary motion into the hollow cylinder 1 is provided in a headstock 19. Furthermore, the corresponding end of the hollow cylinder 1 is closed in as airtight a manner as possible by the supporting cone 18 at the headstock end.

A hollow shaft 20 in a tailstock 21 introduces air into the interior of the hollow cylinder 16. The pressure of air is somewhat increased in a suitable fashion relative to the ambient pressure. A radial blower 22, for example, is provided for supplying this air and feeds the compressed air to the hollow shaft 20 via an air line 23.

A carriage 24 is moved in the direction of the longitudinal axis 5 of the hollow cylinder 1 while the hollow cylinder 1 is rotating. A solid body laser 25 is provided on and moves with the carriage 24. The laser 25 is switched on and off in synchronism with the pattern information. A deflection mirror 26, also mounted on the carriage 24, deflects the laser beam from the laser 25 so that it impinges radially on the surface of the hollow cylinder 1. A spindle 27 with a flange-connected stepping motor 28 drives the carriage 24.

Guides 29 are responsible for the exact parallel guidance of the carriage 24. These guides 29 are fitted in a fixed manner to a machine bed 30 and run parallel to the axial direction 5 of the hollow cylinder 1.

The machine bed 30, standing on feet 31, carry both the tailstock 21 and the headstock 19. The tailstock 21 can be displaced in the longitudinal direction of the hollow cylinder 1. For this purpose, the tailstock 21 is arranged on guides 32 which are fastened on the machine bed 30. In this way, the position of the tailstock 21 can be matched to different lengths of the hollow cylinder 1. In addition, the tailstock 21 can be pushed away from the hollow cylinder 1 for exchanging the hollow cylinder 1. Thus, the hollow cylinder 1 can subsequently be simply removed backwards from the machine.

An angle transmitter 33 (encoder) gives the respective angular position of the hollow cylinder 1 to a computer 34 via a data line 35. Via a control unit, the computer 34 transmits the stepping pulses to the stepping motor 28 via a line 36, and the switch-on and switch-off instructions to the solid body laser 25 via a line 37.

Figure 8:
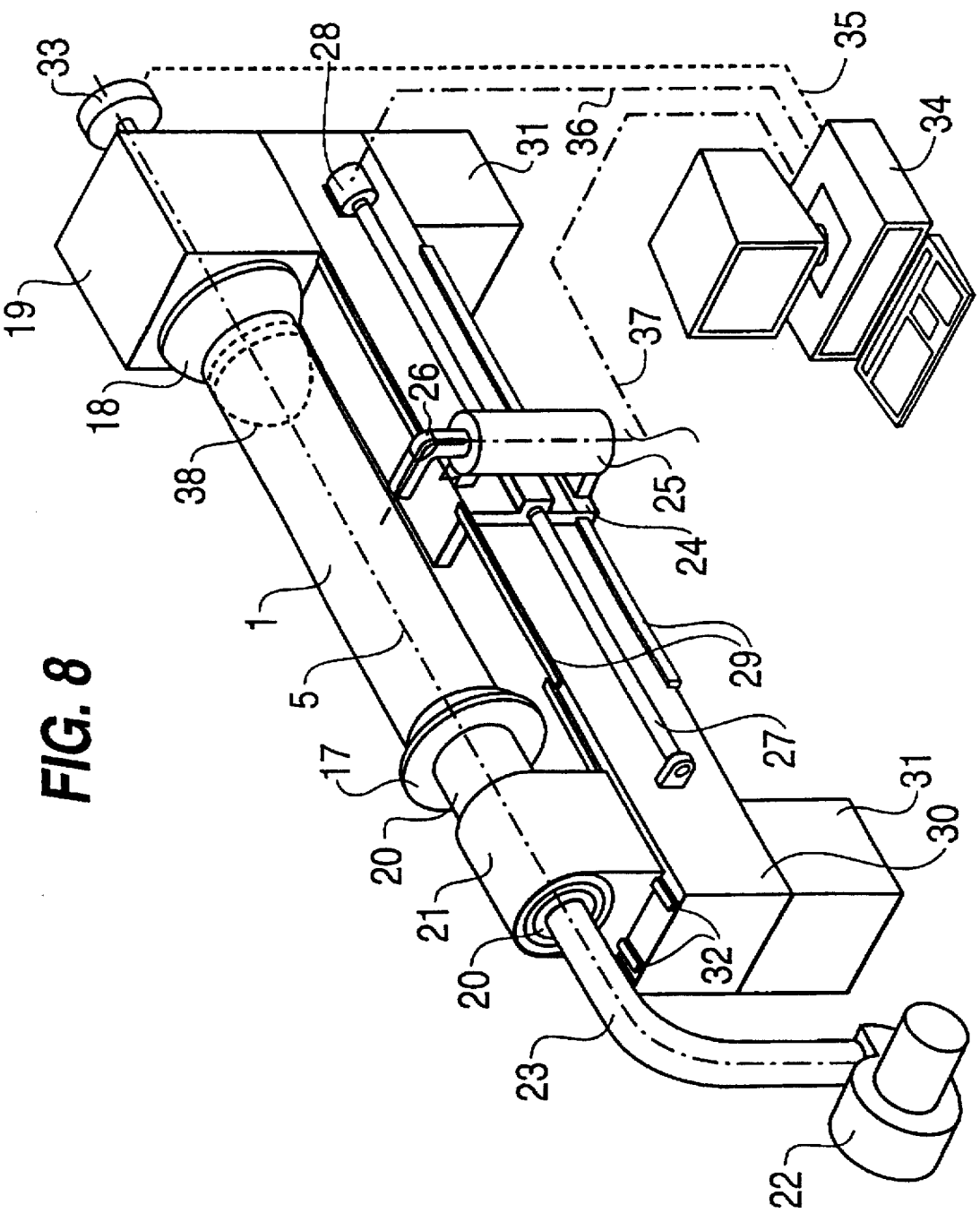
FIG. 8 shows a device for exposing a matrix comprising a hollow cylinder and light-sensitive layer.

If the hollow cylinder 1 is clamped in a device according to FIG. 8, a bending moment acts on the machine bed 30. This bending moment is a result of the product of the entire pressure force acting on the tailstock 21 and the headstock 19, and the distance between the axis of rotation 5 of the hollow cylinder 1 and the axis of the center of gravity of the cross-section of machine bed 30. This bending moment curves the machine bed 30, in the region between the headstock 19 and the tailstock 21, upwards in the direction of the hollow cylinder 1. Although these deformations, compared with the entire dimensions of the engraving device, are very small, the guides 29 provided on the machine bed 30 for the engraving carriage 24 are curved in relation to the axis of rotation 5 of the hollow cylinder 1. Hence, the guides 29 are curved in relation to the outer generatrix of the hollow cylinder 1 to an extent which is often quite noticeable, particularly in the case of fine engraving operations.

In order to counter this effect, the hollow cylinder 1 is equipped in its interior with a sealing piston 38 which seals on its inner wall and which, via a strand-like element, here a cord, transmits pressure force picked up by the sealing piston 38 to the tailstock 21, has the effect that no bending moment acts on the machine bed 30 any more. The force in the strand-like element, here the cord force, acts on the tailstock 21 as a tensile force and is equal in magnitude opposite in direction to the sum of all the pressure forces which act on the tailstock 21. Details of this sealing are disclosed in more detail in commonly assigned co-pending application entitled "Apparatus and Method for Machining of a Hollow Cylinder" filed on even date herewith and having an attorney docket number 1739-129P, which is hereby incorporated by reference.

It is essential that no transverse force is transmitted onto the tailstock 21 via the strand-like element or cord. In order to ensure this, the strand-like element or cord can run at least approximately in the direction and position of the axis of rotation 5 of the hollow cylinder 1, can then optionally be guided around a first deflection roller and a second deflection roller and, for example, be wound up on a cord drum or unwound from the latter. Of course, the course of the strand-like element can also deviate somewhat from the position of the axis of rotation 5. This deviation is a function of the design and the stiffness of the machine bed 30, since curvatures of the machine bed 30 are noticeable in the engraved image only when they exceed a specific limiting amount.

The sealing piston 38 is driven as far as possible towards the supporting cone 18, but without touching the cone 18. The air blown into the cylinder 1 is used for moving the sealing piston 38 in this direction. After the engraving operation is finished, the sealing piston 38 can be drawn in the direction of the supporting cone 17 with the aid of the strand-like element or cord. The sealing piston 38 is then placed on the supporting cone 17, so that the hollow cylinder 1 can be removed from the engraving machine without the sealing piston 38 falling from the supporting cone 17.

The sealing piston 38 can be supported, for example, on a central tension anchor via ball bearings, so that it can rotate with the hollow cylinder 1 around the tension anchor when the hollow cylinder 1 is rotated. The tension anchor is then coupled with the strand-like element or cord and simultaneously drives the sealing piston 38 in the axial direction of the hollow cylinder 1.

After completing the engraving process with the aid of the device shown in FIG. 8, the developing step already mentioned is carried out in order to obtain the structures shown in FIGS. 5 and 6. There then follows the formation of the screen and the removal of the screen from the hollow cylinder in accordance with FIGS. 9 to 11.

After the exposure and development of the light-sensitive coating layer 4 (photoresist layer) on the hollow cylinder 1, a pattern image in the form of small points of coating now lies on the surface of the hollow cylinder 1. This coating is resistant to water and, to a certain extent, to chemicals, so that the coating survives the subsequent method step, in which pure nickel is electroplated onto the surface in a moderately acidic nickel chloride or nickel sulphate electrolyte. The points of coating may not separate from the surface of the hollow cylinder 1 during this process. The pH value of the electrolyte lies in this case at pH=3 to 4, the temperature between 40° and 60° C. The coating is a synthetic resin, mostly acrylate, and must of course remain insulating even during the action of the electrolyte.

Figure 9:
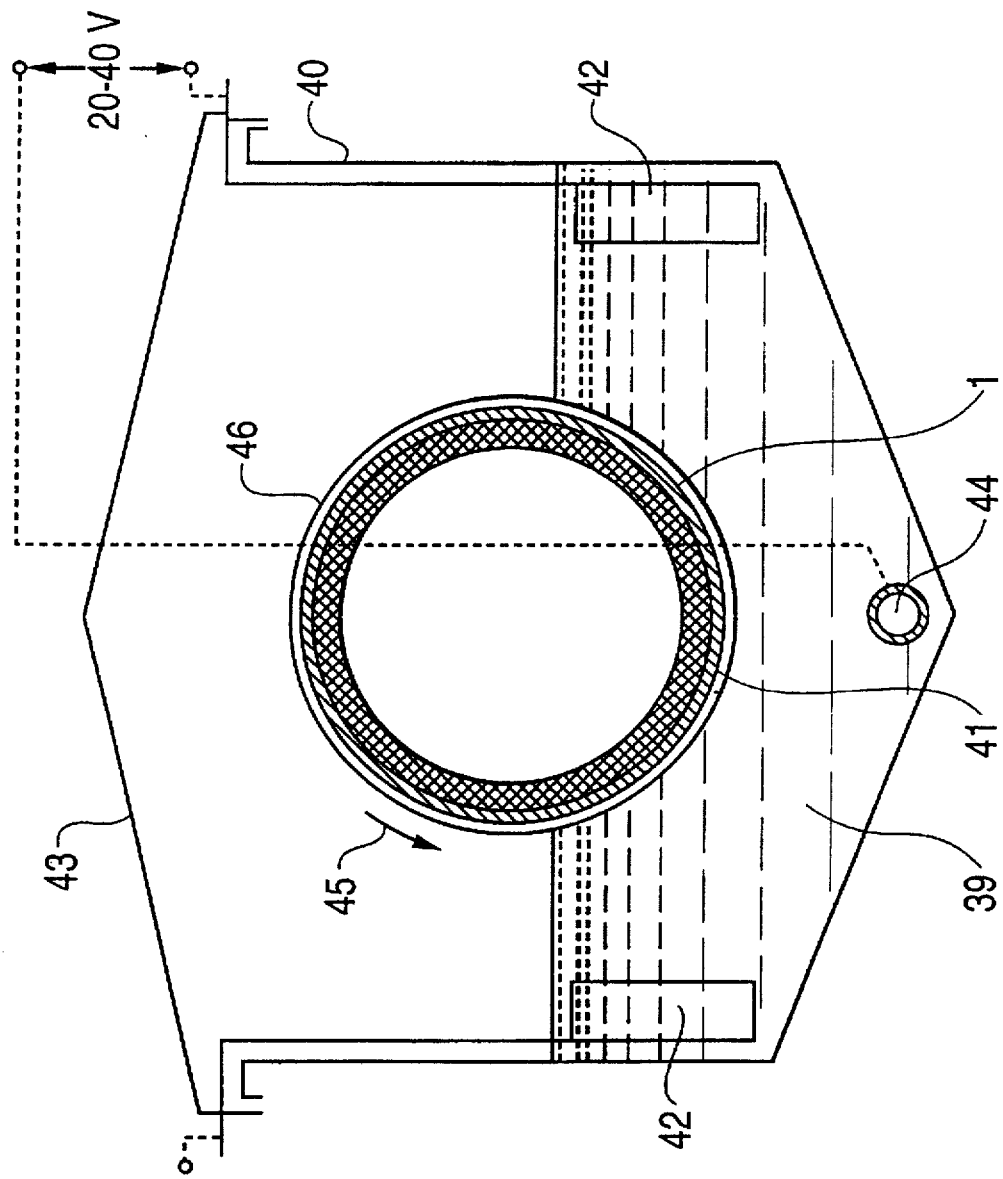
FIG. 9 shows applying a metallic layer to the matrix.

The process of applying nickel in the electroplating bath is shown in FIG. 9. Once more, the thin-walled hollow cylinder 4 is partially immersed in an electrolyte 39. This electrolyte 39 is situated in a trough 40 made of insulating plastic.

A rubber hose 41 with a wall thickness of about 3 to 4 mm is provided in the interior of the hollow cylinder 1. This rubber hose 41 is filled with compressed air (at pressures preferably at 1 to 2 bar). As a result, the hollow cylinder 1 not only remains largely rounded, but also, in spite of the loading as a result of the lift forces of the electrolyte bath, remains largely dimensionally stable. Typically, the hollow cylinder 1 has dimensions of approximately 200 to 350 mm diameter and has a length of about 2000 to 4000 mm. The immersion depth into the electrolyte is always chosen such that the bending of the hollow cylinder 1 does not exceed a few tenths of a millimeter.

Anode baskets 42 have a DC voltage of +20 to +40 V applied to them. The hollow cylinder 1 is connected to zero potential via slip ring contacts. Nickel squares are situated in the anode baskets 42. Due to the applied voltage, the nickel squares dissolve in the electrolyte. Simultaneously, nickel is deposited on the hollow cylinder surface which is connected as a cathode.

The entire apparatus is covered by a lid 43 during the nickel application process, so that no dust gets into the bath and that vapors which are damaging to health cannot escape.

Air is blown in at the bottom of the trough 40 via a line 44, in order for the electrolyte 39 to maintain a uniform concentration and to prevent any hydrogen bubbles which form from remaining stuck to the surface of the hollow cylinder 1. In addition, the hollow cylinder 1 is rotated in the direction of the arrow 45 in order to form a uniformly thin film of pure nickel on its surface, specifically where the surface of the hollow cylinder 1 is not covered by coating. At the points which are covered with coating, small screen openings are maintained, since the coating was applied in the form of small insulating points during the previous method steps. When a pure nickel film 46 of about 0.1 mm thick has been grown, the hollow cylinder 1 is lifted out of the bath.

If the hollow cylinder 1, or at least its outer covering surface, consists of nickel, then, before it was placed into the bath, there was already a very thin layer of nickel oxide on the surface of the hollow cylinder 1. The nickel oxide layer does not significantly impair the electrical conductivity and which, for reasons of safety, was further reinforced by having chromic acid poured briefly over it. This nickel oxide layer, which is always exhibited by nickel in air, has the effect that the adhesion of the applied pure nickel film 46 is severely reduced by affine forces. However, a residual adhesion is still present and must also remain present, since otherwise this pure nickel film 46 would become creased in the bath, and hence unusable, as a result of bending loading of the hollow cylinder 1 on the side of its bending pressure loading, that is to say the lower half of the hollow cylinder dipping into the bath.

However, by using additives and controlling the bath (temperature and specific current loading), pressure stresses may be built up in the applied pure nickel film 46. In spite of this, the adhesion forces of this film, even if only small, must be detached from the surface of the hollow cylinder 1, which consists of nickel oxide. This is best effected by releasing thrust stresses between the nickel oxide layer and the pure nickel film 46.

Figure 10:
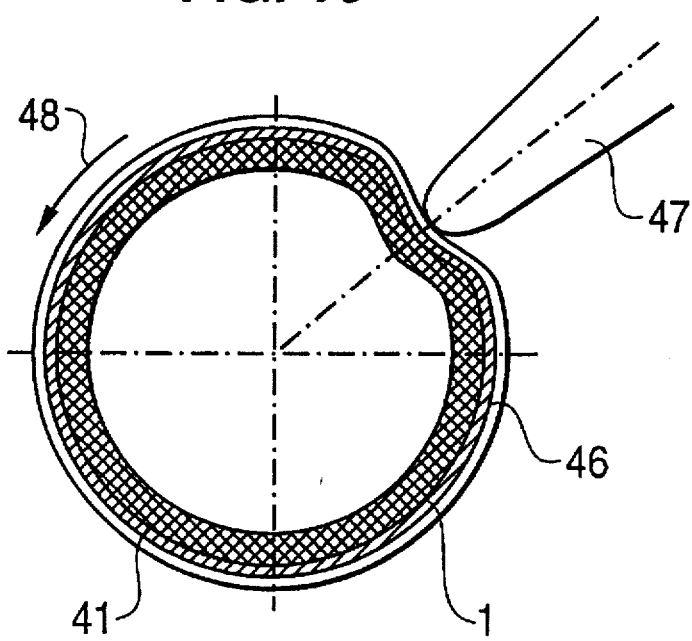
FIG. 10 shows separating a screen-like metallic layer from the matrix.
Figure 11:
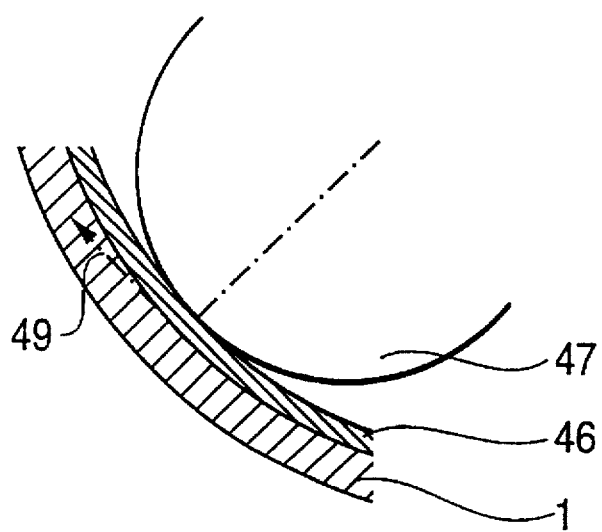
FIG. 11 shows a section from FIG. 10 to explain a force distribution in the dented region.

As shown in FIGS. 10 and 11, for this release, the hollow cylinder 1, taken out of the bath, together with the pure nickel film 46 located on the hollow cylinder 1, is deformed by the action of a blunt, rounded object 47. The object 47 presses here radially towards the center of the hollow cylinder 1, inside which the hose 41 may still be situated. Also, during this operation, the hollow cylinder 1 rotates in the direction of the arrow 48. As a result, the hollow cylinder 1, and with it the pure nickel film 46, bends inward slightly. This bending produces a dent at the pressure point. This dent results in a local thrust stress 49, as shown in FIG. 11. This thrust stress 49 virtually cancels the adhesion forces between the nickel oxide layer and the pure nickel film 46. For reasons of clarity, the hose 41 is not shown in FIG. 11. As a result of low pressure stresses built up within the pure nickel film 46 during the nickel application process, the diameter of the pure nickel film 46 becomes slightly greater and the screen sleeve 14, which is patterned and consists of the pure nickel film 46 (see FIG. 7) can subsequently be drawn off from the cylinder 1.

The invention being thus described, it will be apparent that the same may be varied in many ways. For example, other shapes, such as rectangles, may be used for the ground plane stubs. Such variations are not to be regarded as a departure from the spirit and scope of the invention, and such modifications as would be obvious to one skilled in the art are intended to be included within the scope of the following claims.

What is claimed is:

1. A method of producing a screen printing stencil, comprising the following steps:

applying a light-sensitive layer to an essentially closed covering surface of a hollow cylinder;

inflating the hollow cylinder via at least one of its ends by a compressed gas to such an extent that the hollow cylinder obtains a circular cross-section;

removing portions of the light-sensitive layer from the covering surface in accordance with a prescribed screen pattern;

forming a cylindrical screen by filling removed portions of the light-sensitive layer with metal; and removing the cylinder screen from the hollow cylinder.

2. The method according to claim 1, wherein said inflating step includes blowing compressed gas into the hollow cylinder via both ends.

3. The method according to claim 1, wherein said inflating step includes using air as the compressed gas.

4. The method according to claim 1, wherein said removing of the light-sensitive layer includes exposing the light-sensitive layer to a laser beam.

5. The method according to claim 4, wherein said removing of portions of the light-sensitive layer includes burning away these portions by laser radiation.

6. The method according to claim 5, wherein said applying step includes applying an adhesion reinforcing layer on the surface of the hollow cylinder and a pigmented layer on the adhesion reinforcing layer.

7. The method according to claim 4, wherein said removing of portions of the light-sensitive layer includes polymerizing said layer by laser radiation and subsequently developing said layer.

8. The method according to claim 7, wherein said applying step includes applying a pigmented first resin layer on the surface of the hollow cylinder and a second transparent and photosensitized resin layer on the first resin layer.

9. The method according to claim 8, further comprising more sensitivity than the first resin layer more weakly than the second resin layer.

10. The method according to claim 4 wherein said exposing exposure of the light-sensitive layer is carried out in such a way that later screen openings have different distances from one another.

11. The method according claim 1, further comprising, simultaneous with filling the removed portions of the light-sensitive layer with metal, reinforcing the hollow cylinder from the inside.

12. The method according to claim 11, wherein said reinforcing step includes introducing a hose into the hollow cylinder and resting the hose on the inner wall of the hollow cylinder.

13. The method according to claim 12, further comprising inflating the hose.

14. The method according to claim 1, wherein said forming step includes applying nickel as the metal.

15. The method according to claim 1, wherein said removing step includes pressing the cylindrical screen radially inward to remove the cylindrical screen from the hollow cylinder.

16. The method according to claim 15, wherein said pressing forms a dent providing a local thrust stress sufficient to overcome adhesion forces between the cylindrical screen and the hollow cylinder.

* * * * *